(12) United States Patent
Tandoi et al.

(10) Patent No.: US 12,015,245 B2
(45) Date of Patent: Jun. 18, 2024

(54) TAILORING OF HIGH POWER VCSEL ARRAYS

(71) Applicant: II-VI Delaware, Inc., Wilmington, DE (US)

(72) Inventors: Giuseppe Tandoi, Zurich (CH); Norbert Lichtenstein, Langnau a. Albis (CH); Lukas Mutter, Uster (CH); Andre Bisig, Einsiedeln (CH)

(73) Assignee: II-VI Delaware, Inc., Wilmington, DE (US)

( * ) Notice: Subject to any disclaimer, the term of this patent is extended or adjusted under 35 U.S.C. 154(b) by 0 days.

(21) Appl. No.: 18/110,120

(22) Filed: Feb. 15, 2023

(65) Prior Publication Data

US 2023/0208103 A1 Jun. 29, 2023

Related U.S. Application Data

(63) Continuation of application No. 16/481,897, filed as application No. PCT/US2019/018143 on Feb. 15, 2019, now Pat. No. 11,594,857.

(60) Provisional application No. 62/632,652, filed on Feb. 20, 2018.

(51) Int. Cl.
*H01S 5/0683* (2006.01)
*H01S 5/183* (2006.01)
*H01S 5/42* (2006.01)

(52) U.S. Cl.
CPC ........ *H01S 5/0683* (2013.01); *H01S 5/18311* (2013.01); *H01S 5/423* (2013.01)

(58) Field of Classification Search
CPC ..... H01S 5/0683; H01S 5/18311; H01S 5/423
See application file for complete search history.

(56) References Cited

U.S. PATENT DOCUMENTS

| | | | |
|---|---|---|---|
| 6,747,794 B2 | 6/2004 | Wang | |
| 6,765,943 B2 | 7/2004 | Jewell | |
| 6,931,187 B2 | 8/2005 | Kim et al. | |
| 8,247,252 B2 | 8/2012 | Gauggel et al. | |
| 8,355,423 B2 | 1/2013 | Moser et al. | |
| 9,742,154 B2 | 8/2017 | Dallesasse et al. | |
| 11,594,857 B2 * | 2/2023 | Tandoi | ............... H01S 5/18391 |
| 2003/0039294 A1 | 2/2003 | Ueki | |
| 2007/0091959 A1 | 4/2007 | Royo | |
| 2007/0091960 A1 | 4/2007 | Gauggel et al. | |
| 2012/0114005 A1 | 5/2012 | Inao | |
| 2013/0272330 A1 | 10/2013 | Joseph | |
| 2017/0353012 A1 | 12/2017 | Barve | |
| 2019/0067906 A1 | 2/2019 | Yuen | |

FOREIGN PATENT DOCUMENTS

WO WO 2013/014457 1/2013

* cited by examiner

*Primary Examiner* — Yuanda Zhang
(74) *Attorney, Agent, or Firm* — Wendy W. Koba

(57) ABSTRACT

Modification of the topology of selected regions of individual VCSEL devices during fabrication is utilized to provide an array output beam with specific characteristics (e.g., "uniform" output power across the array). These physical features include at least the width of the metal aperture, the width of the oxide aperture, and/or the geometry of the contact ring structure on the top of the VCSEL device. The modifications may also function to adjust the numerical apertures (NAs) of the devices, the beam waist, wallplug efficiency, and the like.

20 Claims, 7 Drawing Sheets

TAILORING OF HIGH POWER VCSEL ARRAYS

CROSS-REFERENCE TO RELATED APPLICATIONS

This application is a continuation of U.S. application Ser. No. 16/481,897, which claims the benefit of U.S. Provisional Application No. 62/632,652, filed Feb. 20, 2018 and herein incorporated by reference.

TECHNICAL FIELD

The present invention relates to vertical cavity surface-emitting laser (VCSEL) arrays and, more particularly, to a method of modifying the topology of selected regions of individual VCSEL devices during fabrication to provide an array output beam with specific characteristics.

BACKGROUND OF THE INVENTION

Vertical cavity surface-emitting laser (VCSEL) arrays tend to be non-uniform in terms of uneven power distribution across the emitters forming the array and, as a result, in the generated laser array output beam. Non-uniformity can be caused by temperature gradients, non-uniform activation current distribution across the array, fabrication variations, and the like. Besides non-uniformity in the power level at each emitter, the size of the beam waist associated with each emitter, as well as its numerical aperture (NA), may differ in value, resulting in additional non-uniformities across the array output.

Typically, the power of the centrally-located emitters within an array is lower than the power in the emitters at the periphery of the array. The beam waist and NA at the centrally-located emitters are also found to be typically smaller than in the peripheral emitters in many array configurations.

SUMMARY OF THE INVENTION

The present invention is particularly directed to mitigating unwanted non-uniformities in VCSEL arrays, and, more particularly, to a method of modifying the topology of selected regions of individual VCSEL devices during fabrication to provide an array output beam with specific characteristics.

In accordance with the principles of the present invention, one or more physical features of individual VCSEL devices are modified in a manner that modifies an optical property of its output beam. More particularly, the physical features utilized to provide beam modification include the width of the metal aperture, the width of the modal filter, and/or the geometry of the contact ring structure on the top of the VCSEL device. One or more of these features may be adjusted within an array structure to modify the performance of the array. For example, adjustments may be made to improve the uniformity of the output power from the individual devices within the array. The modifications may also function to adjust the numerical apertures (NAs) of the devices, the beam waist, wallplug efficiency, and the like.

An exemplary embodiment of the present invention takes the form of a method of controlling optical properties of an array of vertical cavity surface-emitting laser (VCSEL) devices, including the steps of: a) determining an optical output property of a VCSEL array to be controlled; b) selecting one or more physical features of a VCSEL device to be modified to provide the optical output property determined in step a); and c) modifying geometries of selected physical features of individual VCSEL devices forming the VCSEL array to provide the optical output property determined in step a).

Another embodiment of the present invention is presented as an array of vertical cavity surface-emitting laser (VCSEL) devices exhibiting physical features specifically tailored to provide a predetermined optical array output property. The array itself is formed of a plurality of individual VCSEL devices, each device comprising: a pair of distributed Bragg reflectors (DBRs), an active region disposed between the pair of DBRs, an oxide layer formed in proximity to the active region (and having a central oxide aperture defining properties of an emitted beam), a mode filter of a defined aperture disposed over an upper DBR of the pair of DBRs, a dielectric layer formed over the upper DBR (and having openings defined for providing contact to the upper DBR), and a metal contact layer disposed over the dielectric layer (the metal contact layer including a central aperture defining an emission window of the VCSEL). Selected ones of the mode filter apertures, metal layer apertures and contact openings in the dielectric layer of selected ones of the plurality of VCSEL devices are specifically tailored to provide the desired optical array output property.

Other and further aspects and features of the invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

As will be described in detail below, various embodiments of the present invention relate to VCSEL array configurations where one or more physical features of individual devices forming the array are modified to create an array output beam having a defined characteristic (for example, uniform output power across the array). These physical features are associated with configuring the optical properties of the emitted beam, and are selected from the group consisting of the metal aperture diameter, mode filter diameter, and contact ring geometry of the individual VCSEL devices. The "contact ring geometry" referring to the width of the contact opening and/or the placement of the opening with respect to the emission window of the VCSEL. In accordance with the present invention, one or more of these physical features are varied across the extent of a VCSEL array so as to "tailor" the optical beam waist (and/or NA, and/or emitter power) of the array in order to achieve, for example, higher output uniformity. The variation in physical features is provided by control of the process steps used to pattern, etch, and deposit the appropriate materials in the determined order.

Figure 1:
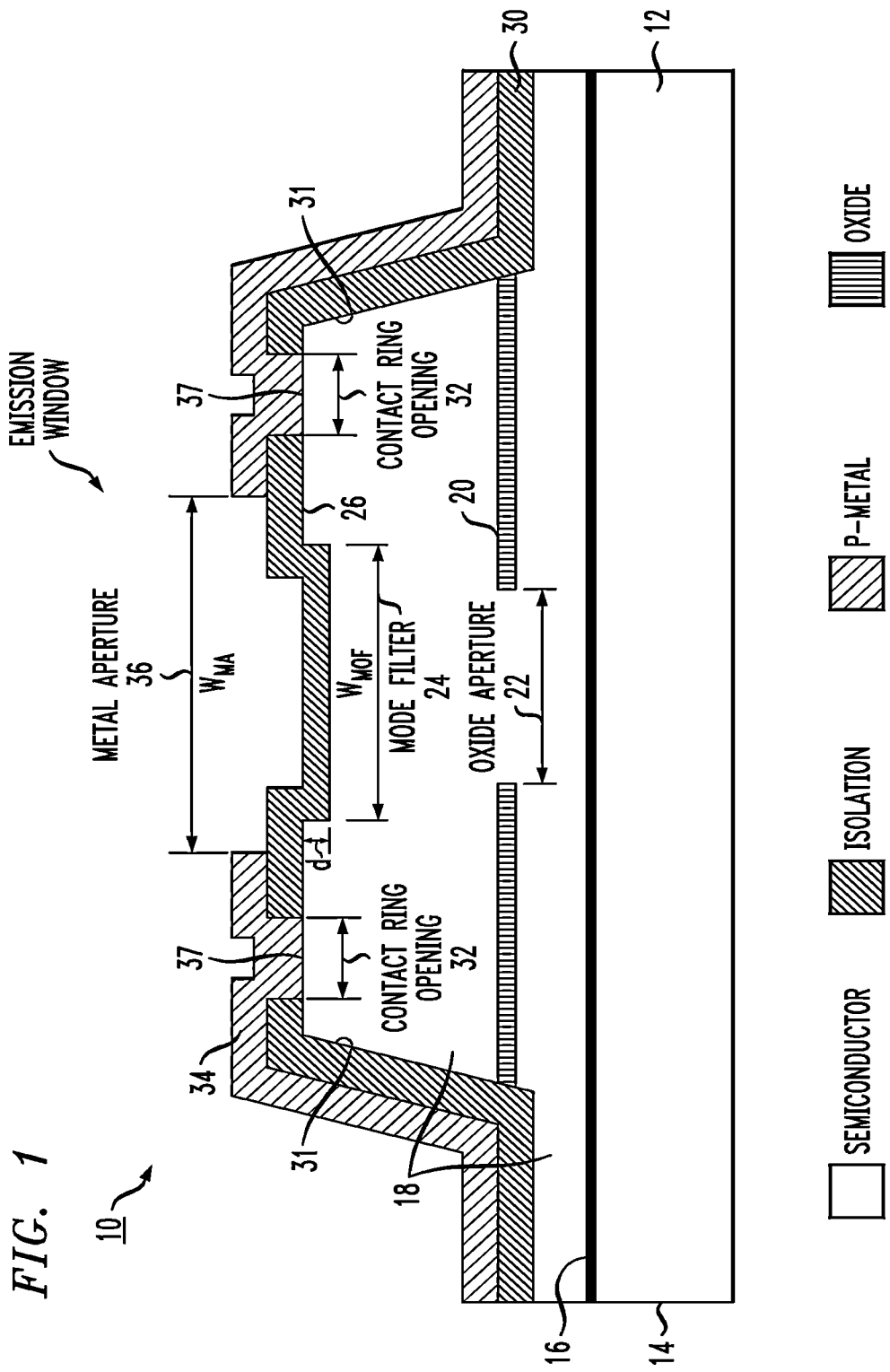
FIG. 1 is a simplified diagram of a relevant portion of a single VCSEL device, illustrating the set of physical features that may be adjusted to provide tailoring of the array output in accordance with the present invention.

FIG. 1 is a simplified diagram of a relevant portion of a single VCSEL device 10, illustrating the set of physical features that may be adjusted (in size and/or location) to provide tailoring of the array output in accordance with the present invention. VCSEL 10 includes a first distributed Bragg reflector (DBR) structure 12 formed within a substrate 14, and an active region 16 formed over first DBR 12. A second DBR 18 (in this example having a mesa structure) is formed over active region 16. An oxide layer 20 is formed within a lower layer of second DBR 18, relatively close to active region 16. Through processes well-known in the art, oxide layer 20 is created to include a (conductive/transparent) central aperture 22 (referred to at times hereinafter as "oxide aperture 22"). As is well-known in the art, the diameter of oxide aperture 22 is influential in defining the size of the output beam ("emission window") exiting through the top of second DBR 18.

Also shown in FIG. 1 is a mode filter 24, formed by etching through a thickness of a top surface 26 of second DBR 18. A mode filter is defined as a lateral variation in the optical thickness of one or more layers in the DBR structure, and may be provided, for example, by etching of a GaAs contact layer or a SiN dielectric layer within the emission window of the laser beam. Alternatively, local deposition of additional layer(s) of material (by epitaxial growth, for example) may be used to perturb the modal pattern in the emission window, providing a shift of the phase of the beam and altering the reflectivity (or alternatively "its reflection") in this lateral region.

In most cases, the etch depth d of mode filter 24 is on the order of about 50 nm, which is the depth required to have final thickness of a top GaAs layer of the stack of layers forming second DBR 18 equal to one-half of the emission wavelength. The etched area has a larger reflectivity that the surround portion of the GaAs layer that is not etched, and thus produces a variation in the spatially-dependent optical loss at the emission window. For the purposes of the present invention, the width of the etched region forming mode filter 24 is defined as the "mode filter diameter", and at times referenced hereafter as $W_{MOF}$.

A dielectric layer 30 is formed as a passivation/protective coating over the exposed surfaces of VCSEL 10, including mesa sidewalls 31 of second DBR 18. A contact ring opening 32 is formed within the top of dielectric layer 30, surrounding the emission window, and a contact metal layer 34 is deposited over dielectric layer 30 such that metal layer 34 also fills contact ring opening 32 to provide electrical contact to second DBR 18 at exposed area 37 of second DBR 18. While not shown, an additional electrical contact is made in some fashion to first DBR 12, typically through the bottom surface of substrate 14.

As also shown in FIG. 1, a central portion of metal layer 34 is removed over the emission window of VCSEL 10, allowing the lasing radiation to exit through the top of VCSEL 10. For the purposes of the present invention, this central opening in metal layer 34 is defined as a "metal aperture" 36, with a width shown as $W_{MA}$.

The VCSEL structure itself is grown on substrate 14 by one of the known epitaxial growth techniques, including, but not limited to, MBE and MOVPE. The details of the growth process are relevant to the purposes of the present invention only to the extent that they are modified to adjust the sizes (and/or locations) of the various physical features (e.g., metal aperture, mode filter, contact ring) utilized in accordance with the present invention to specifically tailor the optical properties of the VCSEL array (e.g., NA, beam width, WPE, output power, and the like).

In one exemplary embodiment, substrate 14 may comprise a GaAs substrate; however, the use of other substrate compositions and material systems are known within the industry and deemed to fall within the scope of the present invention (these other material systems may include, for example, InP, GaP, GaSb, and GaN). Thus, while the following discussion will at times refer to a GaAs-based VCSEL construction, it should be considered as for explanatory purposes only.

Regardless of the specific material system, first DBR 12 and second DBR 18 both comprise a plurality of pairs of doped layers of alternating high and low refractive index values. The thickness of each pair of doped layers is equivalent to an optical path length of substantially one-half of the lasing wavelength of VCSEL 10. In the example of substrate 14 comprising GaAs, first DBR 12 and second DBR 18 may be formed from AlGaAs, with alternating chemical compositions. Active region 16 typically comprises a heterostructure of p-i-n form including quantum wells (although other configurations are possible).

As will be discussed in detail below in association with FIGS. 2-5, the sizes of mode filter 24, metal aperture 36, and contact ring 32 may all be varied to achieve a desired distribution of a specific optical output property, such as optical output power, beam waist size of individual emitters (and their NA), wallplug efficiency (also referred to as "WPE", and defining the ratio between input electrical power and output optical power), and the like. While in most cases the desired result is to achieve uniformity in these optical output properties across the VCSEL array, specific applications may desire to "tailor" the profile such that VCSEL devices in one area of the array exhibit a different performance than the remaining VCSEL devices. The ability to individually control the mode filter, metal aperture, and/or contact ring configurations (perhaps in combination with variations in the oxide aperture) allows for a significant degree of tailoring to be available.

Figure 2:
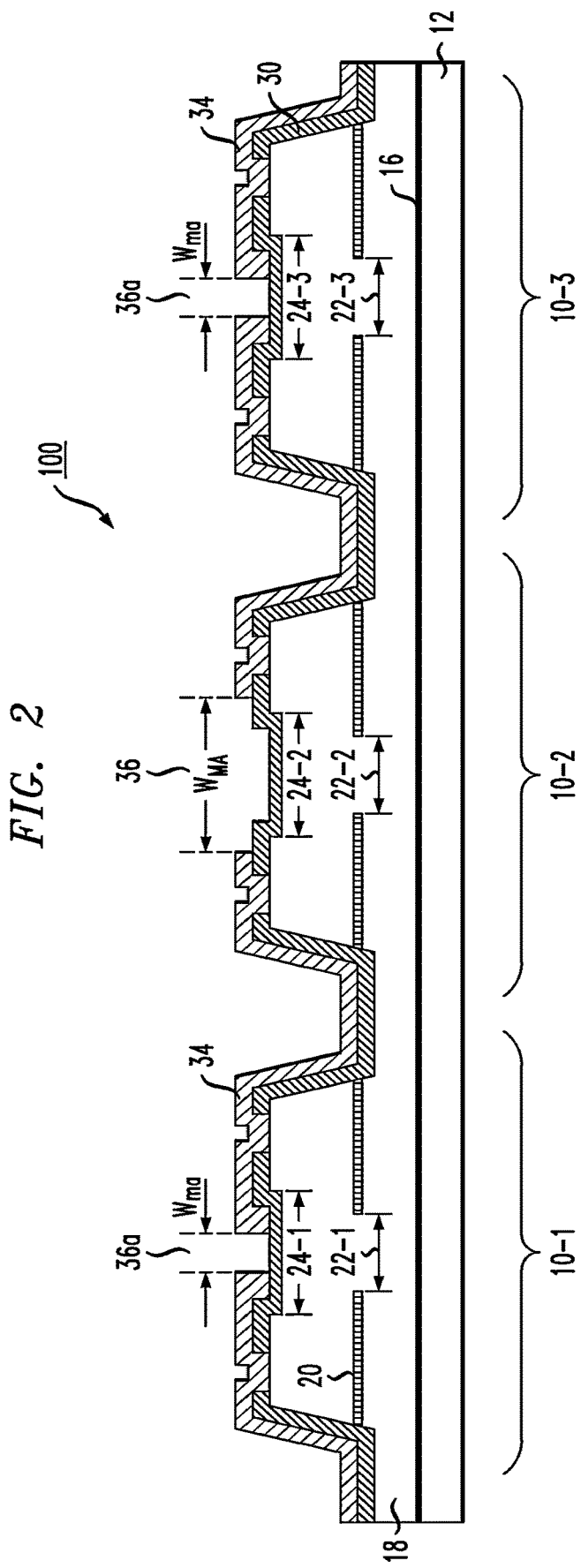
FIG. 2 is a linear array of VCSELs where the size of the metal aperture is adjusted to provide the tailoring of the array output.

FIG. 2 illustrates an exemplary VCSEL array 100 formed in accordance with the present invention, where in this particular embodiment, the diameter of metal apertures 36 for selected VCSEL devices is modified (as controlled during fabrication). For example, the diameters of metal aperture 36 for individual devices may be adjusted to improve beam waist uniformity across the extent of array 100. For the sake of simplicity, illustrated array 100 includes only a set of three VCSELs 10-1, 10-2, and 10-3. It is to be understood that a commercial configuration of an array (which may be one-dimensional or a two-dimensional array)

will likely include many more individual VCSEL devices (also referred to at times as "emitter regions").

Metal layer 34 is usually a p-type metal (typically, a three-layer stack of Ti—Pt—Au). Metal aperture 36 typically overlaps the emission window of the beam and, therefore, the beam will interact with metal aperture 36. In particular, metal aperture 36 blocks a portion of the beam exiting the emission window, with the surrounding portion of metal layer 34 producing a backreflection that alters the phase of the beam in this particular region. Thus, a larger metal aperture 36 results in a wider beam waist in the emitted beam, as well as a larger output power value. The effectiveness of the metal aperture in controlling the beam waist (or NA or emitted power) depends on the amount of overlap of the metal aperture with the emission window of the beam. This overlap is geometrically determined by the difference in diameter between metal aperture 36 and oxide aperture 22, where typically a difference on the order of 3-4 µm results in very weak or no effect on emitter output, with a smaller difference on the order of 1-2 µm considered to be a typical range for controlling the emitter output. It is also understood that the typical values mentioned above also depend on the epitaxial design of the VCSEL itself.

In most cases, a "nominal" value for the diameter of metal aperture 36 is in the range of 10-14 µm, depending on a desired beam waist value (and NA) for a particular application. In accordance with the principles of the present invention, the VCSEL(s) in the center region of the array (such as VCSEL 10-2 in this example) may be formed to have a selected nominal value for the diameter of metal aperture 36 (shown as $W_{MA}$ in FIGS. 1 and 2). The remaining VCSELs "toward the periphery of the array", in this case VCELs 10-1 and 10-3, are therefore fabricated in accordance with this embodiment of the present invention to have smaller-diameter metal apertures. Here, the metal apertures are denoted 26a, with a diameter of $W_{ma}$, where $W_{ma} < W_{MA}$. The decrease in diameter may be on the order of 1.0 µm, but may also be as little as, for example, 0.3 µm, or as large as, for example, 2.0 µm, in extreme cases. The decrease in diameter of metal aperture 36 from the center of the array towards its periphery will therefore compensate for the increase in beam waist (perhaps as a function of temperature gradient) across this same profile of the array.

For example, VCSEL 10-2 may be fabricated to have a metal aperture 36 with a diameter $W_{MA}=12$ µm. In accordance with the principles of the present invention, and specifically in order to provide uniformity of beam waist across an array where the outer devices are known to exhibit a larger beam waist, VCSELs 10-1 and 10-3 may fabricated to have a metal aperture 36a with a diameter $W_{ma}=11$ µm (i.e., $W_{ma} < W_{MA}$). As a result, the difference in beam waist between the beam emitted from VCSEL 10-2 and the beams emitted from VCSELs 10-1 and 10-3 will be reduced and a more uniform output from array 100 will be provided.

It is to be understood that alternatively the VCSELs in the outer periphery of the array may be defined as having a "target"/nominal metal aperture value, with the value then increasing toward the center of the array (for the case where the beam waist was found to smaller toward the center of the array). Moreover, in actual array configurations of a large number of individual VCSEL devices, the variations in a physical feature (such as metal aperture 36) may be varied gradually across the extent of the array. Alternatively, groups of VCSEL devices within specific regions of an array may all be formed to have the same physical feature size, with each group having a specific value determined to provide the desired tailoring effect in the optical output properties.

Additionally, it is to be noted that this specific variation in the width of the metal aperture across the VCSEL array is associated with improving the uniformity of the beam waists for the individual emitter regions. If there is a need to otherwise configure the set of beam waists to define a specific profile, it is an aspect of the present invention that the diameters of the individual metal apertures may be adjusted to "tailor" the profile in the desired manner.

Moreover, it is possible to also vary oxide aperture 22 in combination with the variation of metal aperture 36. It has been known that variation of the oxide aperture can be used to improve output power uniformity (or, alternatively, to improve wallplug efficiency). In accordance with the present invention, the reduction of the oxide aperture in combination with the reduction of the metal aperture of the outer VCSELs within the array may provide additional ability to tailor the output as desired.

Figure 3:
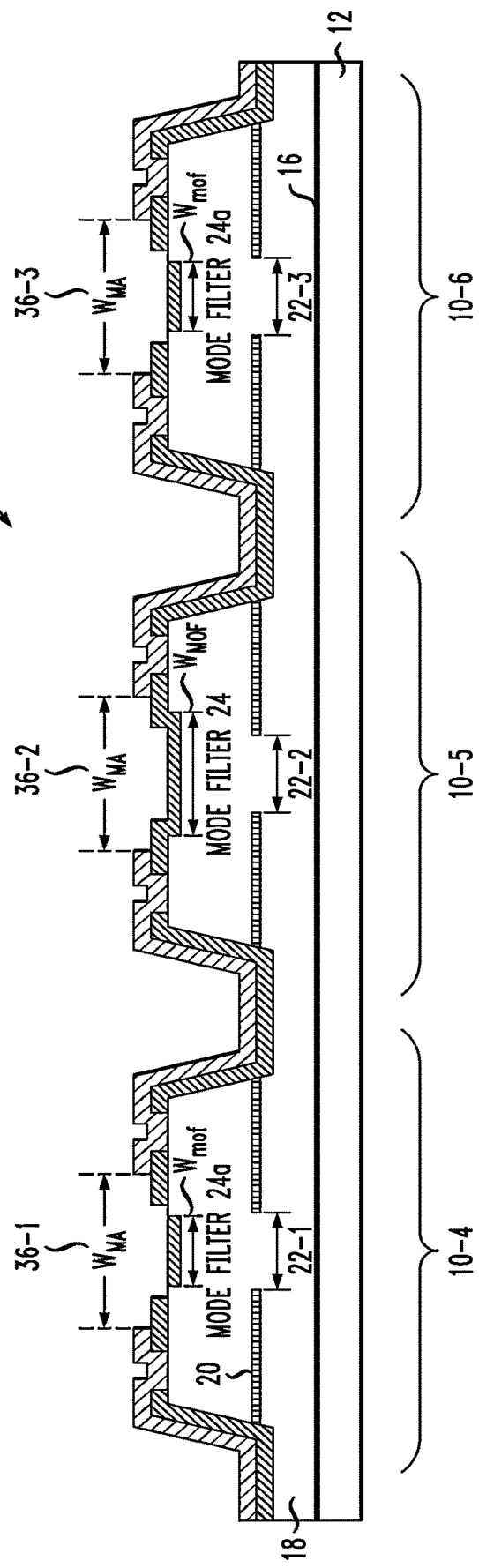
FIG. 3 is a linear array of VCSELs where the diameter of the mode filter is adjusted to provide the tailoring of the array output.

FIG. 3 illustrates an exemplary VCSEL array 200 formed in accordance with another embodiment of the present invention, where in this case the diameter of mode filter 24 ($W_{MOF}$) is adjusted in size across the array to tailor the beam waist of the individual emitter regions to achieve a desired result (for example, uniform beam waist, profiled beam waist, etc.). Referring to FIG. 3, a centrally-located VCSEL 10-5 is shown as having a mode filter 24 with a defined "maximum" width ($W_{MOF}$). VCSELs 10-4 and 10-6 are fabricated in accordance with this embodiment of the present invention to have mode filters with a narrower diameter, shown here as mode filters 24a, with a diameter of $W_{mof}$ (where $W_{mof} < W_{MOF}$). Conventional patterning and etching techniques, well-known in the art, can be used to provide variability in the width of the mode filter as a function of location along VCSEL array 200. Indeed, it to be understood that in most cases such an array would have a larger number of individual VCSELs, and their respective mode filter diameters may be tailored to decrease in diameter from the center outward toward the periphery of the array.

Similar to metal aperture 36, the effectiveness of mode filter 24 in controlling the beam waist (or NA or emitted power) depends on the amount of overlap (in terms of surface) between mode filter 24 and the emission window of the beam. This overlap is geometrically determined (similar to the approach discussed above) by the difference between the diameter of a given mode filter 24 and its associated oxide aperture 22, wherein a difference on the order of 3-4 µm typically results in weak or no effect on the emitter output, and a difference in the range of 1-2 µm typical for controlling the emitter output. Again, these exemplary values also depend on the epitaxial design of the VCSEL.

As with metal aperture 36, the target diameter for mode filter 24 is typically in the range of 10-14 µm, and once a value is established for a given VCSEL device in the array, the diameters of the remaining mode filters adjusted accordingly. As with the metal aperture, the variations for mode filter diameter falling within the range of about ±0.3 µm to about ±2.0 µm, with ±1.0 µm being a typical value. In most cases, the larger values are associated with VCSELs in the center portion of the array, and the smaller values are associated with VCSELs in the outer periphery of the array (this variation being associated with providing uniformity in output across the array).

It is to be understood that oxide aperture 22 may also be adjusted in combination with the diameter of mode filter 24, again providing an additional degree of tailoring to the beam waist profile across the VCSEL array.

It is also to be noted that the control of beam waist (or NA) discussed in the exemplary embodiments of the present invention is not limited to the use of circular shapes etched in the mode filter, or opened in the metal aperture. Alternative embodiments of the present invention can involve the utilization of more complex, two-dimensional patterns that are etched in the mode filter layer or opened in the metal aperture layer. Such patterns, instead of providing a circular reflectivity profile, produce a more complex two-dimensional reflectivity profile in order to favor a specific optical mode pattern and thus stabilize the beam characteristics. In these alternative embodiments, the effect on beam characteristics depends again on the overlap of the emission window and the regions with altered reflectivity defined in the mode filter or metal aperture.

In these cases, other key dimensions specific of the particular embodiment have therefore to be varied over the array in order to tailor the beam characteristics across the array, as compared to the simpler variation of the mode filter diameter or metal aperture diameter discussed in association with previous embodiments. The variation of such key dimensions is selected such that the overlap between the emission window and the regions with altered reflectivity is increased for emitters where larger effect on beam characteristics is desired.

Figure 4:
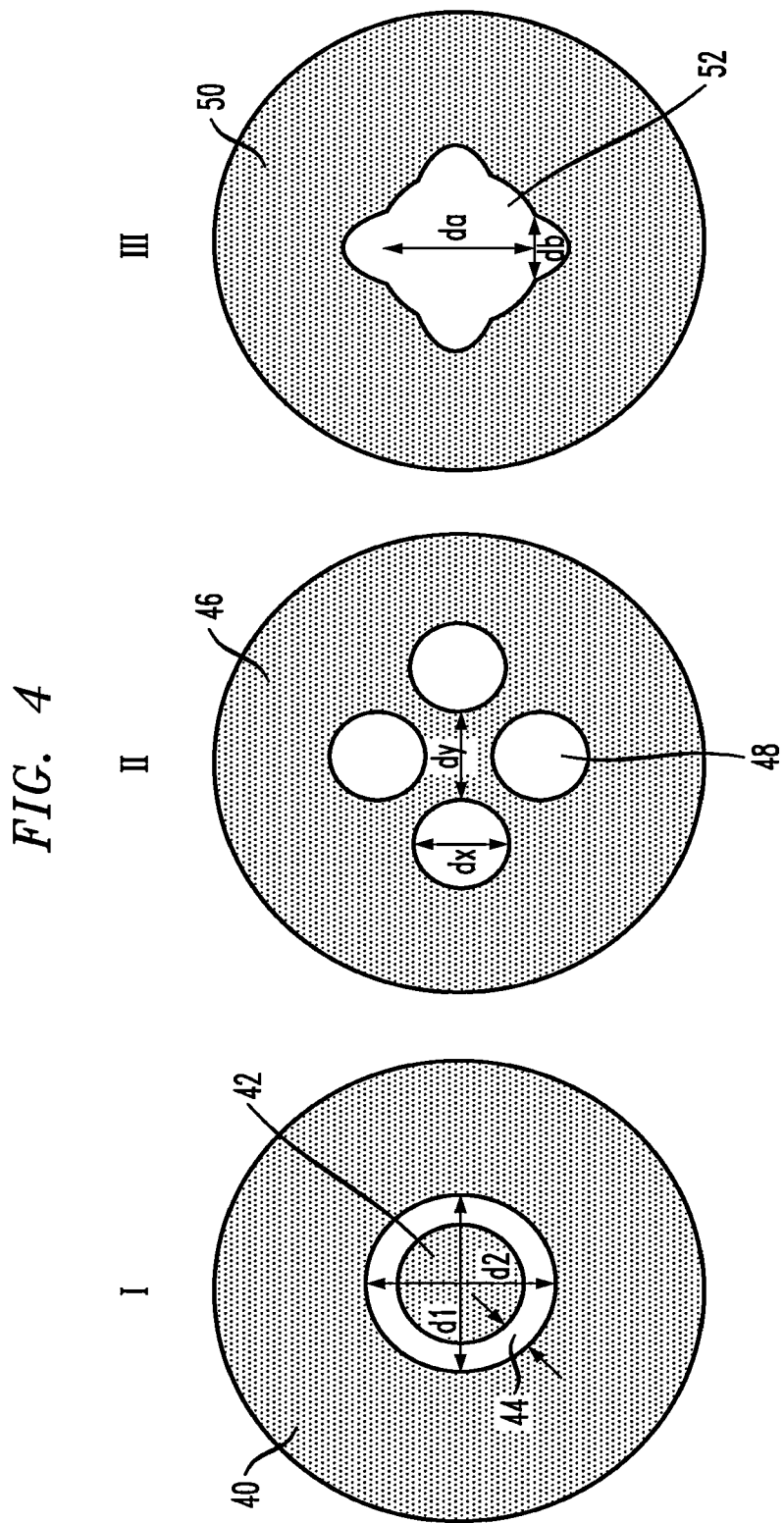
FIG. 4 illustrates a set of various geometries that may be used in the formation of either the metal aperture (FIG. 2) or mode filter (FIG. 3) to further modify the physical features of individual VCSEL devices and provide a greater degree of adjustment to the operating characteristics of the VCSEL array.

Examples of alternative, two-dimensional patterning configurations (useful for either mode filter 24 or metal aperture 36) are shown in FIG. 4, which are shown as top views, looking down onto the two-dimensional topology of a given mode filter or metal aperture. Diagram I in FIG. 4 illustrates a configuration including a pair of concentric disks 40 and 42. Outer disk 40 is shown as having a central aperture of d1, with inner disk having a diameter of d2 (d2<d1), thus forming a gap 44 between disks 40 and 42. Diagram II illustrates a configuration where a disk 46 is formed to include a plurality of spaced-apart apertures 48, with each aperture having a diameter dx, and a lateral spacing of dy between pairs of aligned apertures. The configuration shown in diagram III is a composite structure, where a disk 50 is formed to including a central aperture area 52 shaped in two dimensions by the values of da and db. It is to be understood that these particular configurations are exemplary only, and any specific configuration of key tailorable dimensions may be used to provide the desired shaping of beam waist, NA and/or emitter power in accordance with the principles of the present invention.

Figure 5:
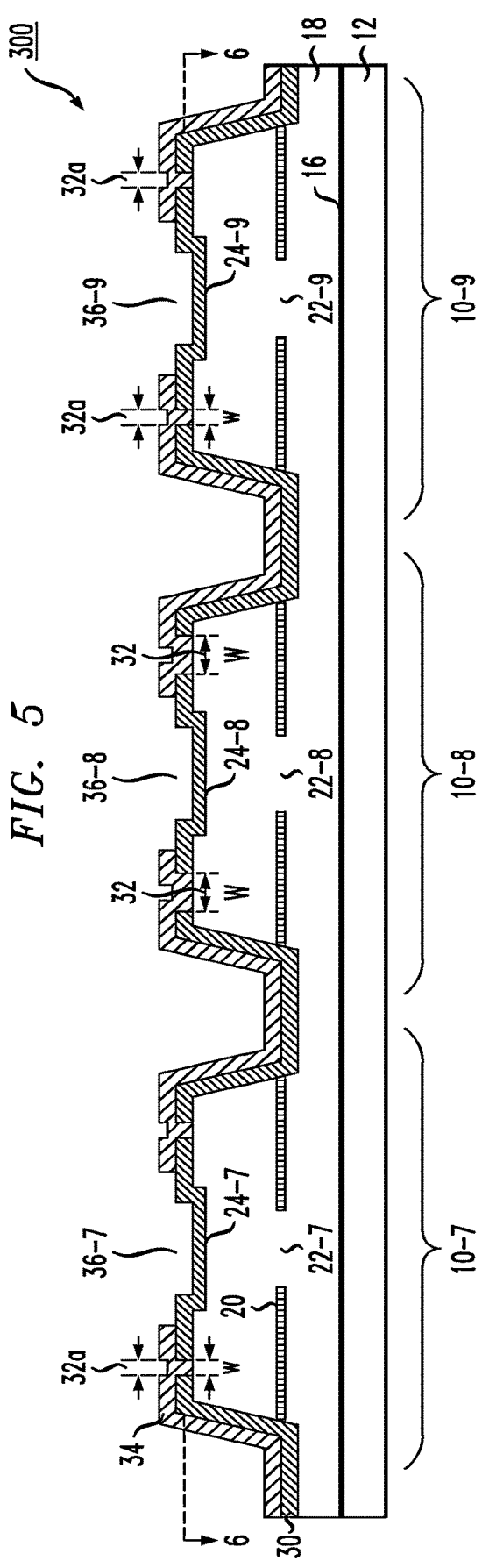
FIG. 5 is a linear array of VCSELs with the size of the contact ring opening is adjusted to provide the tailoring of the array output.
Figure 6:
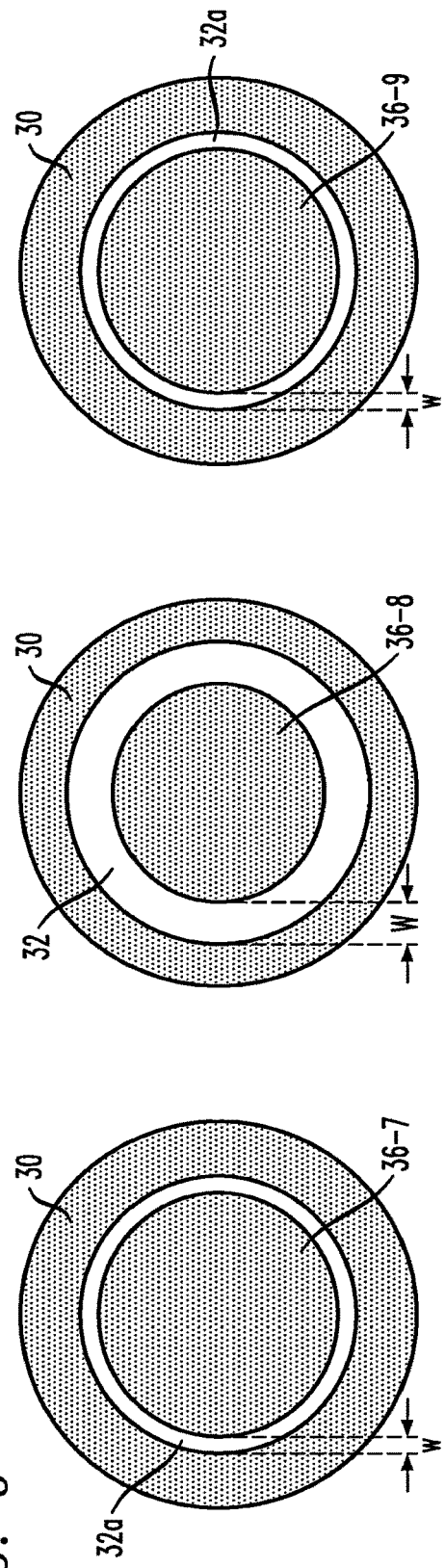
FIG. 6 is a top view of the linear array of FIG. 5, taken along line 6-6.

A further design variation in accordance with the present invention varies the size and/or placement of contact ring openings over the individual VCELs forming an array. FIGS. 5-8 illustrate two different embodiments of the present invention on this point. In particular, FIG. 5 illustrates an exemplary VCSEL array 300 where the size of contact ring opening 32 is varied across the extent of the array. As shown, the opening in dielectric layer 30 is made smaller for VCSELs 10-7 and 10-9 in VCSEL array 300. For these two devices, the contact ring opening is denoted as contact ring opening 32a with a width of "w". This is compared to the nominal configuration as shown in VCSEL 10-8, with contact ring opening 32 having a width "W" (w<W). FIG. 6 is a cut-away top view of dielectric layer 30 taken along line 6-6 of FIG. 5, which clearly illustrates the difference in contact area created by modifying the size of the contact ring opening (32, 32a) for individual VCELs.

Referring to both FIGS. 5 and 6, once metal layer 34 is deposited over this configuration having different-sized contact ring openings, central VCSEL 10-8 will be formed to have a metal contact region 38 of width W (which may be about 3 μm) and narrower metal contact regions 38a for VCSELs 10-7 and 10-9 will be formed to have a width of "w", where A may be about 1 μm. The smaller contact regions thus increase the contact resistance between metal layer 34 and second DBR 18 for these "outer" VCSEL devices.

Figure 7:
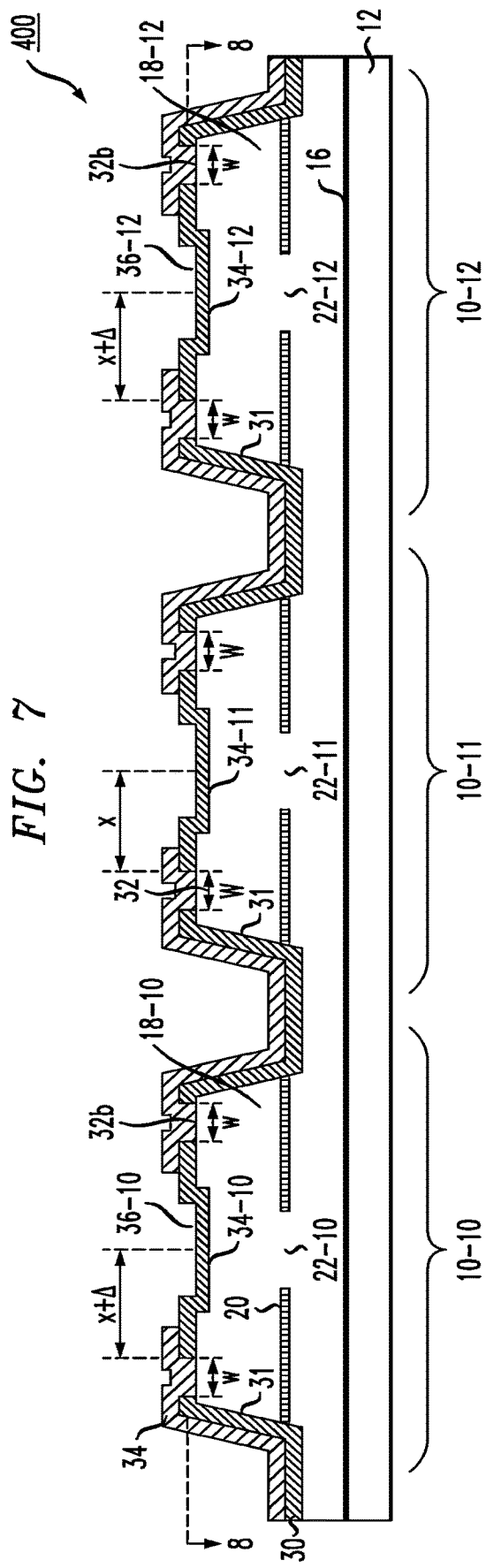
FIG. 7 is a linear array of VCSELs with the placement of the contact ring adjusted for individual devices so as to provide the tailoring of the array output.
Figure 8:
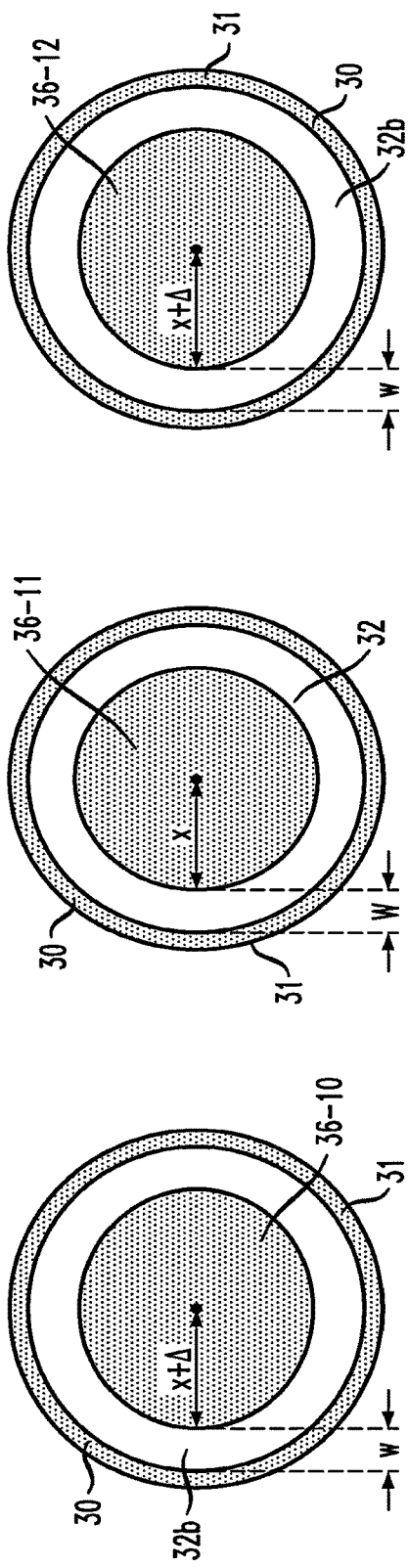
FIG. 8 is a top view of the linear array of FIG. 7, taken along line 8-8.

VCSEL array 400 as shown in FIGS. 7 and 8 illustrates an embodiment of the present invention where the placement of the contact ring opening with respect to the emission window is varied. Referring to VCSEL 10-10, an outer edge of a contact ring opening 32b is shown as disposed relatively close to sidewall portion 31 of dielectric layer 30 (as covering the mesa structure of second DBR 18-10 for VCSEL 10-10). In comparing VCSELs 10-10 and 10-11, it is shown that both devices having a contact ring opening of the same width (W); the difference is that contact ring opening 32b of VCSEL 10-10 is shifted outward with respect to nominal contact ring opening 32 of VCSEL 10-11. This is particularly evident in the cut-away top view of FIG. 8 (which is taken along line 8-8 of FIG. 7). As with the configurations discussed above, VCSEL 10-12 is formed to have a shifted contact ring opening 32b, similar in disposition as that formed for VCSEL 10-10. The displacement of the contact ring opening further away from the center of the oxide aperture ("emission window") introduces a higher resistance for the associated emitter by having a longer distance and the associated sheet resistance.

Figure 9:
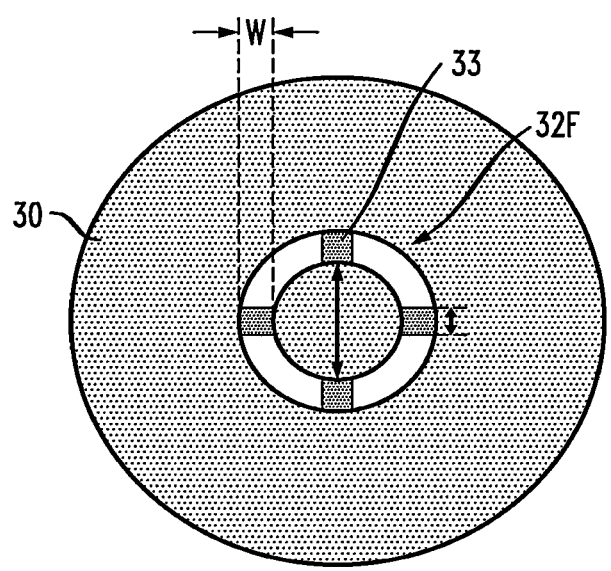
FIG. 9 is a top view of an alternative geometry for contact ring spacing, utilized to further tailor the operating characteristics of the output beam from the VCSEL array.

Obviously, a combination of these two factors regarding the geometry of the contact ring opening may be exploited to tailor the beam waist across the array (including varying the oxide aperture in combination with modifications in the contact ring properties). And similar to the possibilities of providing two-dimensional patterns in the mode filter and metal aperture, it is also possible in accordance with the present invention to create and utilize two-dimensional patterns in contact ring opening 32. FIG. 9 is a top view of a "fractured" contact ring opening 32F, formed to include a plurality of un-doped spots 33 in various locations around contact ring opening 32F. These additional blocking areas perturb the applied signal in a manner that also creates two-dimensional modifications in the beam waist, NA, and emitter power.

Indeed, it is to be understood that a combination of varying the metal aperture, varying the mode filter diameter, and varying the contact ring properties (all with or without variations in the oxide aperture) may be used to tailor the beam waist pattern. Typically, the metal aperture diameter or mode filter diameter is reduced in the periphery of the array to increase output power and beam waist uniformity.

It is to be appreciated and understood that the specific embodiments of the invention as illustrated and described above are merely illustrative of the general principles of the invention. Various modifications may be made upon these embodiments that are consistent with the principles set forth in this description and known technology of VCSEL fabrication. Thus, the scope of the invention is indicated by the appended claims, rather than by the foregoing description.

What is claimed is:

1. A method of controlling optical properties of an array of vertical cavity surface-emitting laser (VCSEL) devices, each individual VCSEL device comprising a pair of distributed Bragg reflectors (DBRs), an active region disposed between the pair of DBRs, an oxide layer formed in proximity to the active region with a central oxide aperture defining properties of an emitted beam, a dielectric layer formed over an upper DBR of the pair of DBRs and having a contact ring opening, and a metal contact layer disposed over the dielectric layer and into the contact ring opening, the metal contact layer including a central aperture defining an emission window of the VCSEL, the method including the steps of:
  a) determining an optical output property of the VCSEL array to be controlled;
  b) selecting one or more physical features of a VCSEL device to be modified to provide the optical output property determined in step a), the one or more physical features selected from the group consisting of: the metal contact layer aperture and contact ring opening geometry; and
  c) modifying geometries of selected physical features of individual VCSEL devices forming the VCSEL array in combination with modifying a diameter of the central oxide aperture to provide the optical output property determined in step a).

2. The method of claim 1 wherein the optical output property determined in step a) is selected from the group consisting of: optical output power of the VCSEL array, wallplug efficiency of the VCSEL array, numerical aperture of each individual VCSEL device forming the VCSEL array, and beam width output of each individual VSEL device forming the VCSEL array.

3. The method of claim 2 wherein the selected optical output property is controlled to be uniform in value across the VCSEL array.

4. The method of claim 2 wherein the selected optical output property is controlled to be a tailored, non-uniform profile across the VCSEL array.

5. The method of claim 1 wherein the metal contact layer aperture and the central oxide aperture both comprise circular apertures, a diameter of the metal contact layer aperture being greater than a diameter of the central oxide aperture, an overlap between the diameters a factor in controlling the beam width output of the individual VCEL devices.

6. The method of claim 5 wherein the diameter of the central oxide aperture is varied in combination with variations in the diameter of the metal contact layer, the diameter of the central oxide aperture increasing as the diameter of the metal contact layer increases and vice versa.

7. The method of claim 1 wherein a width of the contact ring opening is varied in combination with a variation in the central oxide aperture.

8. The method of claim 1 wherein a position of the contact ring opening is varied with respect to changes in the diameter of the central oxide aperture.

9. The method of claim 1, wherein each individual VCSEL further comprises a mode filter formed in a central region of the metal contact layer, the mode filter having a diameter less than the metal control layer aperture and greater than the central oxide aperture, with an overlap between the mode filter diameter and the diameter of the central oxide aperture a factor in controlling the beam width output of the individual VCEL devices.

10. The method of claim 9, wherein the diameter of the central oxide aperture is varied in combination with variations in the diameter of mode filter, the diameter of the central oxide aperture increasing as the diameter of the mode filter increases and vice versa.

11. An array of vertical cavity surface-emitting laser (VCSEL) devices, the array exhibiting physical features tailored to provide a predetermined optical array output property, the array comprising
  a plurality of individual VCSEL devices, each device comprising a pair of distributed Bragg reflectors (DBRs), an active region disposed between the pair of DBRs, an oxide layer formed in proximity to the active region and having a central oxide aperture defining properties of an emitted beam, a dielectric layer formed over an upper DBR of the pair of DBRs and having a contact ring opening, and a metal contact layer disposed over the dielectric layer and into the contact ring opening, the metal contact layer including an aperture defining an emission window of the VCSEL,
  wherein selected ones of the metal layer apertures and contact openings in the dielectric layer of selected ones of the plurality of VCSEL devices are configured to provide the desired optical array output property.

12. The array of VCSEL devices as defined in claim 11 wherein a combination of the oxide aperture diameter and the diameter of the metal layer aperture of individual VCSEL devices is modified to provide a predetermined optical output power distribution of the VCSEL array.

13. The array of VCSEL devices as defined in claim 11 wherein a combination of the oxide aperture diameter and the contact ring opening in the dielectric layer of individual VCSEL devices is modified to provide a predetermined optical output power distribution of the VCSEL array.

14. The array of VCSEL devices as defined in claim 11 wherein a width of the contact ring opening is modified to provide the predetermined optical output power distribution.

15. The array of VCSEL devices as defined in claim 11 wherein a spacing of the contact ring opening with respect to the diameter of the oxide aperture is modified to provide the predetermined optical output power distribution.

16. The array of VCSEL devices as defined in claim 11 wherein each individual VCSEL device further comprises a mode filter formed with a central portion of the metal contact layer, a diameter of the mode filter being less than the diameter of the mental contact layer central aperture and greater than the oxide aperture diameter.

17. The array of VCSEL devices as defined in claim 16 wherein a combination of the oxide aperture diameter and the diameter of the mode filter aperture of individual VCSEL devices is modified to provide a predetermined optical output power distribution of the VCSEL array.

18. The array of VCSEL devices as defined in claim 11 wherein the array comprises a one-dimensional array.

19. The array of VCSEL devices as defined in claim 11 wherein the array comprises a two-dimensional array.

20. The array of VCSEL devices as defined in claim 19, wherein the physical features are tailored along both dimensions to provide a predetermined optical array output property.

* * * * *